United States Patent
Lee et al.

(10) Patent No.: US 10,847,587 B2
(45) Date of Patent: Nov. 24, 2020

(54) DISPLAY DEVICE

(71) Applicant: Samsung Display Co., Ltd., Yongin-si (KR)

(72) Inventors: Sangwook Lee, Yongin-si (KR); Changok Kim, Hwaseong-si (KR); Yeoungkeol Woo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 178 days.

(21) Appl. No.: 15/592,418

(22) Filed: May 11, 2017

(65) Prior Publication Data

US 2017/0338288 A1    Nov. 23, 2017

(30) Foreign Application Priority Data

May 23, 2016    (KR) ........................ 10-2016-0063016

(51) Int. Cl.
| | |
|---|---|
| *H01L 27/32* | (2006.01) |
| *H01L 51/52* | (2006.01) |
| *G06F 3/041* | (2006.01) |
| *G06F 3/044* | (2006.01) |

(52) U.S. Cl.
CPC ............ *H01L 27/323* (2013.01); *G06F 3/044* (2013.01); *G06F 3/0412* (2013.01); *H01L 27/3265* (2013.01); *H01L 27/3276* (2013.01); *H01L 51/5253* (2013.01); *H01L 51/5256* (2013.01); *G06F 2203/04112* (2013.01); *H01L 51/524* (2013.01)

(58) Field of Classification Search
CPC ................... G06F 3/0412; G06F 3/044; G06F 2203/04112; H01L 27/323; H01L 27/3265; H01L 27/3276; H01L 51/5256; H01L 51/5253; H01L 51/524
See application file for complete search history.

(56) References Cited

U.S. PATENT DOCUMENTS

| | | | | |
|---|---|---|---|---|
| 2010/0013745 A1* | 1/2010 | Kim | ...................... | G06F 3/0412 345/76 |
| 2011/0109532 A1* | 5/2011 | Choi | ................... | H01L 27/1259 345/76 |
| 2012/0037916 A1 | 2/2012 | Song et al. | | |
| 2014/0326968 A1 | 11/2014 | Lee | | |
| 2015/0170575 A1* | 6/2015 | Kwak | ..................... | G06F 3/047 345/174 |

(Continued)

FOREIGN PATENT DOCUMENTS

| | | |
|---|---|---|
| KR | 10-2009-0121186 | 11/2009 |
| KR | 10-2012-0014786 | 2/2012 |

(Continued)

*Primary Examiner* — Ryan A Lubit
(74) *Attorney, Agent, or Firm* — H.C. Park & Associates, PLC

(57) ABSTRACT

A display device including a display panel including a light emitting device and a thin film sealing layer disposed on the light emitting device, the display panel providing a base surface, and a touch sensing member including a touch electrode layer and disposed on the base surface. The thin film sealing layer includes a first inorganic layer having a first content of hydrogen, and a second inorganic layer disposed on the first inorganic layer and having a second content of hydrogen less than the first content.

20 Claims, 12 Drawing Sheets

(56) References Cited

U.S. PATENT DOCUMENTS

| | | | |
|---|---|---|---|
| 2016/0036000 A1* | 2/2016 | Choi | H01L 51/5253 |
| | | | 257/40 |
| 2016/0306479 A1* | 10/2016 | Zhu | G06F 3/044 |
| 2016/0322454 A1* | 11/2016 | Zhang | H01L 29/78672 |
| 2017/0125743 A1* | 5/2017 | Kim | H01L 27/3244 |
| 2017/0279084 A1* | 9/2017 | Sakamoto | H01L 27/3279 |
| 2017/0331070 A1* | 11/2017 | Mieda | H05B 33/04 |

FOREIGN PATENT DOCUMENTS

| | | |
|---|---|---|
| KR | 20-0478853 | 11/2015 |
| KR | 10-2016-0016138 | 2/2016 |

* cited by examiner

DISPLAY DEVICE

CROSS-REFERENCE TO RELATED APPLICATION

This application claims priority from and the benefit of Korean Patent Application No. 10-2016-0063016, filed on May 23, 2016, which is hereby incorporated by reference for all purposes as if fully set forth herein.

BACKGROUND

Field

Exemplary embodiments relate to a display device integrated with a touch sensing member.

Discussion of the Background

Electronic devices such as a smart phone, a digital camera, a notebook computer, a navigation system, and a smart television have been developed. These electronic devices include display devices to provide information.

The display devices may include touch sensing members that are used as input devices and disposed on display panels. The touch sensing members may be categorized as any one of add-on type touch sensing members, cover glass-integrated type touch sensing members, and display-integrated type touch sensing members. The display-integrated type touch sensing members may include in-cell type touch sensing members and on-cell type touch sensing members.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device having a structure capable of reducing a defect rate occurring in a manufacturing process.

Additional aspects will be set forth in the detailed description which follows, and, in part, will be apparent from the disclosure, or may be learned by practice of the inventive concept.

According to an exemplary embodiment, a display device includes a display panel including a light emitting device and a thin film sealing layer disposed on the light emitting device, the display panel providing a base surface, and a touch sensing member including a touch electrode layer and disposed on the base surface, in which the thin film sealing layer includes a first inorganic layer including a first content of hydrogen, and a second inorganic layer disposed on the first inorganic layer and including a second content of hydrogen less than the first content.

The second inorganic layer may contact a top surface of the first inorganic layer.

The touch electrode layer may contact the base surface.

The second inorganic layer may include the base surface.

At least one of the first inorganic layer and the second inorganic layer may include silicon nitride.

The thin film sealing layer may further include an organic layer contacting a bottom surface of the first inorganic layer.

The touch electrode layer may include first touch patterns and second touch patterns. The first touch patterns may extend in a first direction and arranged in a second direction intersecting the first direction. The second touch patterns may extend in the second direction and arranged in the first direction.

A plurality of touch openings may be defined in the first touch patterns and the second touch patterns.

Each of the first touch patterns may include a plurality of first sensing patterns arranged in the first direction, and a plurality of first connecting patterns each connecting adjacent first sensing patterns.

Each of the second touch patterns may include a plurality of second sensing patterns arranged in the second direction, and a plurality of second connecting patterns each connecting adjacent second sensing patterns.

The display device may further include a plurality of insulating patterns disposed on the first connecting patterns, respectively. The first sensing patterns and the second sensing patterns may be disposed in the same layer, and each of the second connecting patterns may be disposed on a corresponding insulating pattern.

The display panel may further include a plurality of light emitting areas and a non-light emitting area adjacent to the light emitting areas, and each of the light emitting areas may overlap a corresponding touch opening.

According to an exemplary embodiment, a display device includes a display panel including an organic light emitting device and a thin film sealing layer disposed on the organic light emitting device, in which the display panel provides a base surface, and a touch sensing member including a touch electrode layer disposed on the base surface. The thin film sealing layer includes a first inorganic layer having a first etch rate, and a second inorganic layer disposed on the first inorganic layer and having a second etch rate less than the first etch rate.

According to an exemplary embodiment, a display device includes a device layer including an organic light emitting device, a thin film sealing layer providing a base surface and disposed on the device layer, and a plurality of touch electrodes disposed on the base surface. The thin film sealing layer includes an organic layer including a monomer, a first inorganic layer, and a second inorganic layer. The first inorganic layer is disposed on a top surface of the organic layer and has a first etch rate. The second inorganic layer is disposed on a top surface of the first inorganic layer and has a second etch rate less than the first etch rate. The second inorganic layer provides the base surface.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
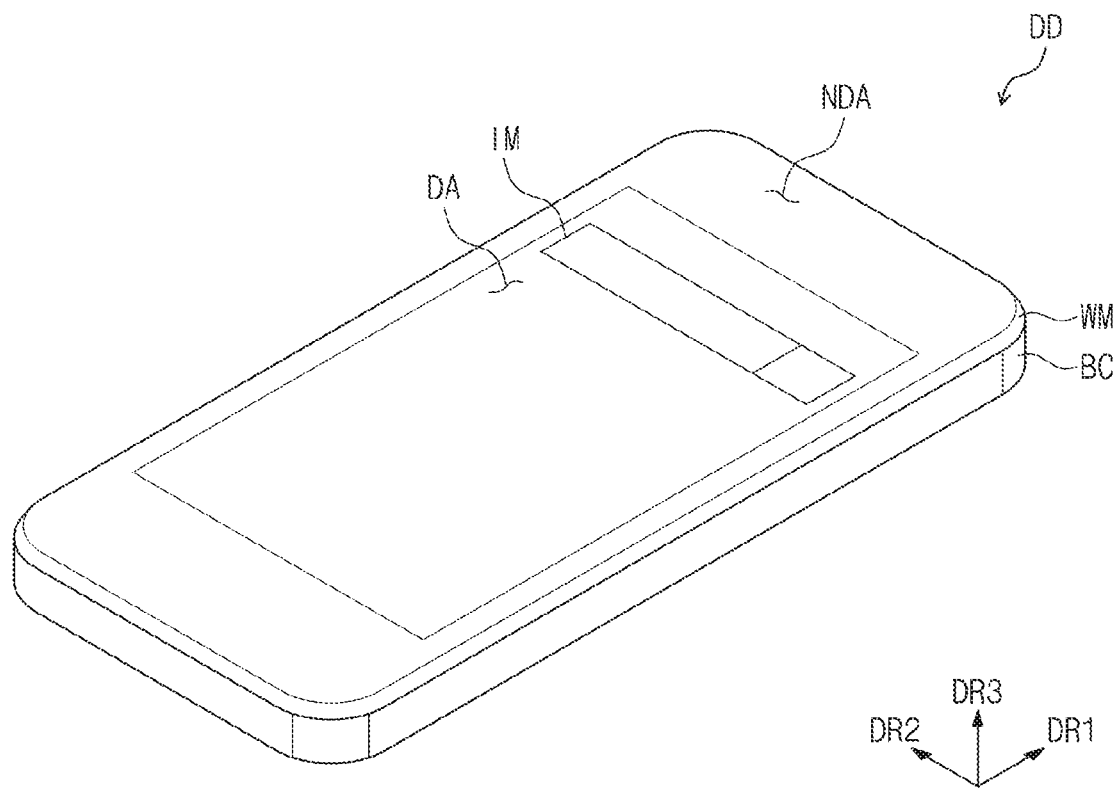
FIG. 1 is a perspective view illustrating a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
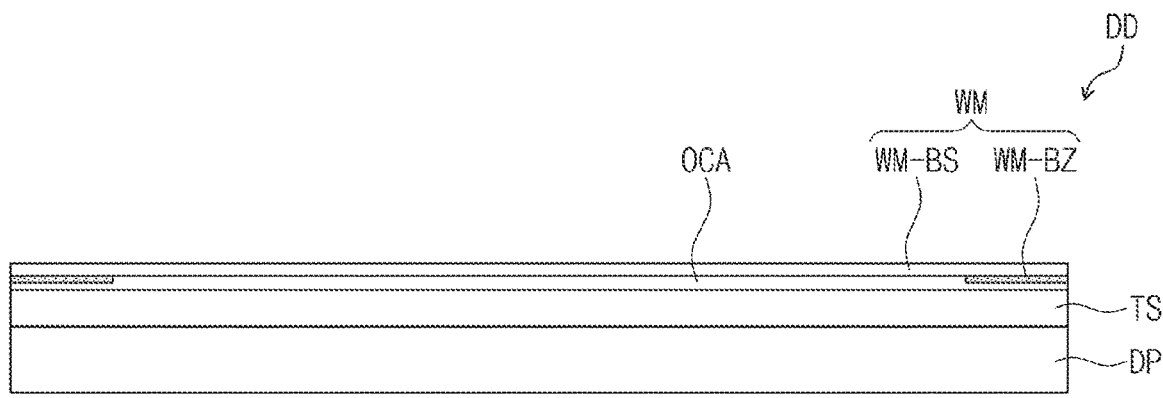
FIG. 2 is a cross-sectional view illustrating a display device according to an exemplary embodiment.

FIG. 1 is a perspective view illustrating a display device DD according to an exemplary embodiment. FIG. 2 is a cross-sectional view of the display device DD of FIG. 1. In FIG. 2, a bottom cover BC of FIG. 1 is omitted for convenience of description.

As used herein, a display surface on which an image IM is displayed is parallel to a plane defined by a first direction DR1 and a second direction DR2. A normal direction of the display surface is parallel to a third direction DR3. The third direction DR3 is a reference direction for distinguishing a front surface and a back surface of each member. However, the directions indicated by the direction axes may be relative and changed into other directions.

FIG. 1 illustrates a portable phone corresponding to a display device DD according to an exemplary embodiment. However, the display device DD according to exemplary embodiments may be applied to large-sized electronic devices (e.g., a television or an external billboard) and small and middle-sized electronic devices (e.g., a personal computer, a notebook computer, a personal digital terminal, a car navigation unit, a game console, a portable electronic device, a watch-type electronic device, or a camera), without being limited thereto.

As illustrated in FIG. 1, the display device DD includes a plurality of areas divided from each other on the display surface. The display device DD includes a display area DA and a non-display area NDA adjacent to the display area DA. The image IM is displayed in the display area DA. FIG. 1 illustrates an internet search engine as an example of the image IM displayed on the display area DA. For example, the display area DA may have a quadrangular shape. The non-display area NDA surrounds the display area DA. In particular, the non-display area NDA may form a border of the display surface.

As illustrated in FIGS. 1 and 2, the display device DD may include a window member WM, a bottom cover BC, a display panel DP, and a touch sensing member TS. The window member WM, the display panel DP, and the touch sensing member TS may be divided into areas corresponding to the display area DA and the non-display area NDA in a plan view. In an exemplary embodiment, each of the window member WM, the display panel DP, and the touch sensing member TS may be flexible.

The bottom cover BC is coupled to the window member WM and receives the display panel DP and the touch sensing member TS. The bottom cover BC may be formed of a plurality of parts or a single body formed by an injection molding method. The bottom cover BC may include a plastic or a metal. In an exemplary embodiment, the bottom cover BC may be omitted.

The display panel DP is a component directly generating the image IM. The display panel DP may be an organic light emitting display panel, an electrophoretic display panel, or an electrowetting display panel, without being limited thereto.

The touch sensing member TS obtains information of coordinates of an external input. The touch sensing member TS is disposed on a base surface of the display panel DP. In an exemplary embodiment, the touch sensing member TS and the display panel DP may be manufactured by a continuous process, which may obviate the need of forming an additional adhesive member between the touch sensing member TS and the display panel DP.

The touch sensing member TS may be a capacitive touch sensing member. However, the touch sensing member TS may be other types of a touch sensing member, such as an electromagnetic touch sensing member.

The window member WM may be coupled to the touch sensing member TS by an optically clear adhesive film OCA. The window member WM includes a base member WM-BS and a bezel layer WM-BZ. The base member WM-BS may include at least one of a glass, a sapphire, or a plastic. The bezel layer WM-BZ partially overlaps the base member WM-BS. The bezel layer WM-BZ may be disposed on one surface of the base member WM-BS to define a bezel area (e.g., the non-display area NDA of FIG. 1) of the display device DD.

The bezel layer WM-BZ may be a colored organic layer and may be formed by, for example, a coating method. Although not shown in the drawings, the window member WM may further include a functional coating layer disposed on a front surface of the base member WM-BS. The functional coating layer may include at least one of an anti-fingerprint layer, an anti-reflection layer, or a hard coating layer.

Figure 3:
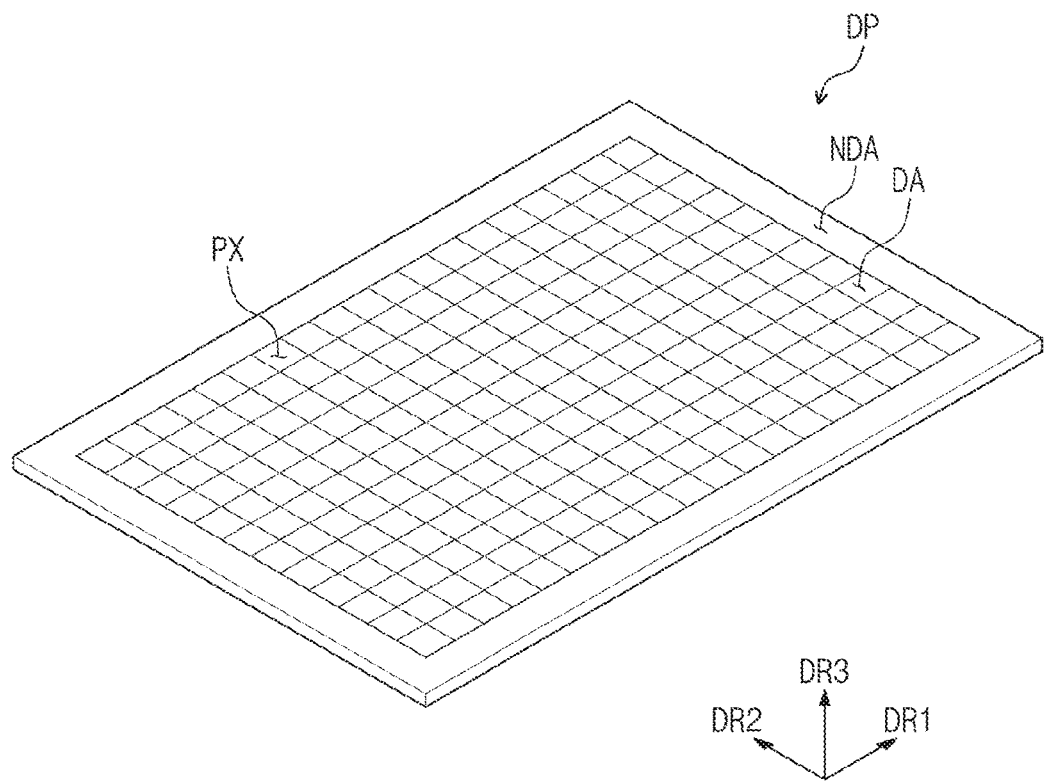
FIG. 3 is a perspective view illustrating a display panel of FIG. 2.
Figure 4:
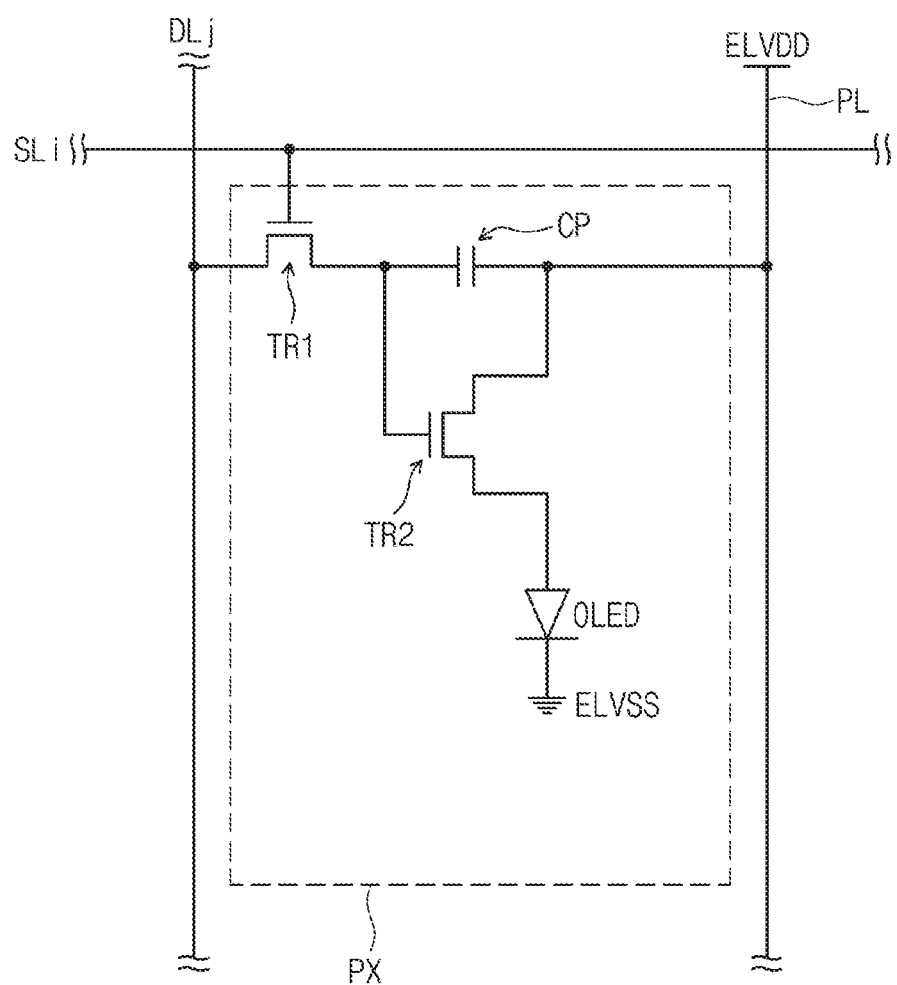
FIG. 4 is an equivalent circuit diagram of a pixel of FIG. 3.

FIG. 3 is a perspective view of the display panel DD illustrated in FIG. 2. FIG. 4 is an equivalent circuit diagram of a pixel PX of FIG. 3. Hereinafter, the display panel DP will be described with reference to an organic light emitting display panel DP.

The organic light emitting display panel DP includes a display area DA and a non-display area NDA, which correspond to the display area DA and the non-display area NDA of the display device DD of FIG. 1, respectively.

As illustrated in FIG. 3, the organic light emitting display panel DP includes a plurality of pixels PX disposed in the display area DA. FIG. 3 illustrates the pixels PX arranged in a matrix form. However, according to an exemplary embodiment, the pixels PX may be alternatively arranged in a non-matrix form, e.g., a pentile matrix form.

FIG. 4 illustrates an equivalent circuit of one pixel PX connected to an i-th scan line SLi and a j-th source line DLj. Although not shown in the drawings, each of the pixels PX may have the same equivalent circuit.

The pixel PX includes at least one transistor TR1 and TR2, at least one capacitor CP, and an organic light emitting device OLED. In FIG. 4, the pixel PX is illustrated as having a pixel driving circuit including two transistors TR1 and TR2 and one capacitor CP as an example. However, the structure or configuration of the pixel driving circuit is not limited thereto.

An anode of the organic light emitting device OLED receives a first source voltage ELVDD supplied from a power source line PL through the second transistor TR2. A cathode of the organic light emitting device OLED receives a second source voltage ELVSS. The first transistor TR1 outputs a data signal applied to the j-th source line DLj in response to a scan signal applied to the i-th scan line SLi. The capacitor CP is charged with a voltage corresponding to the data signal received from the first transistor TR1. The second transistor TR2 controls a driving current flowing through the organic light emitting device OLED in response to the voltage stored in the capacitor CP.

Figure 5:
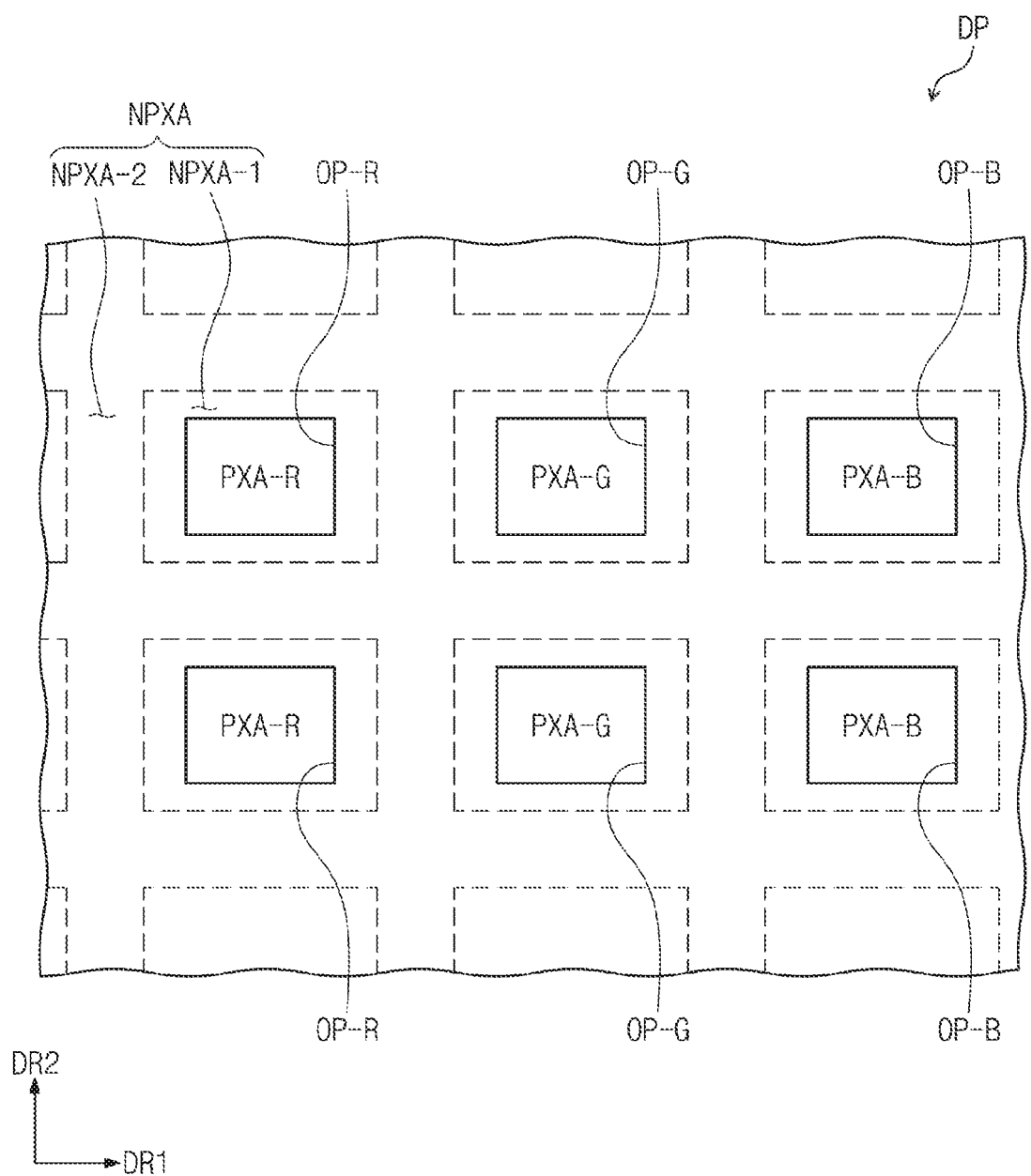
FIG. 5 is a plan view illustrating a portion of an organic light emitting display panel of FIG. 2.
Figure 6A:
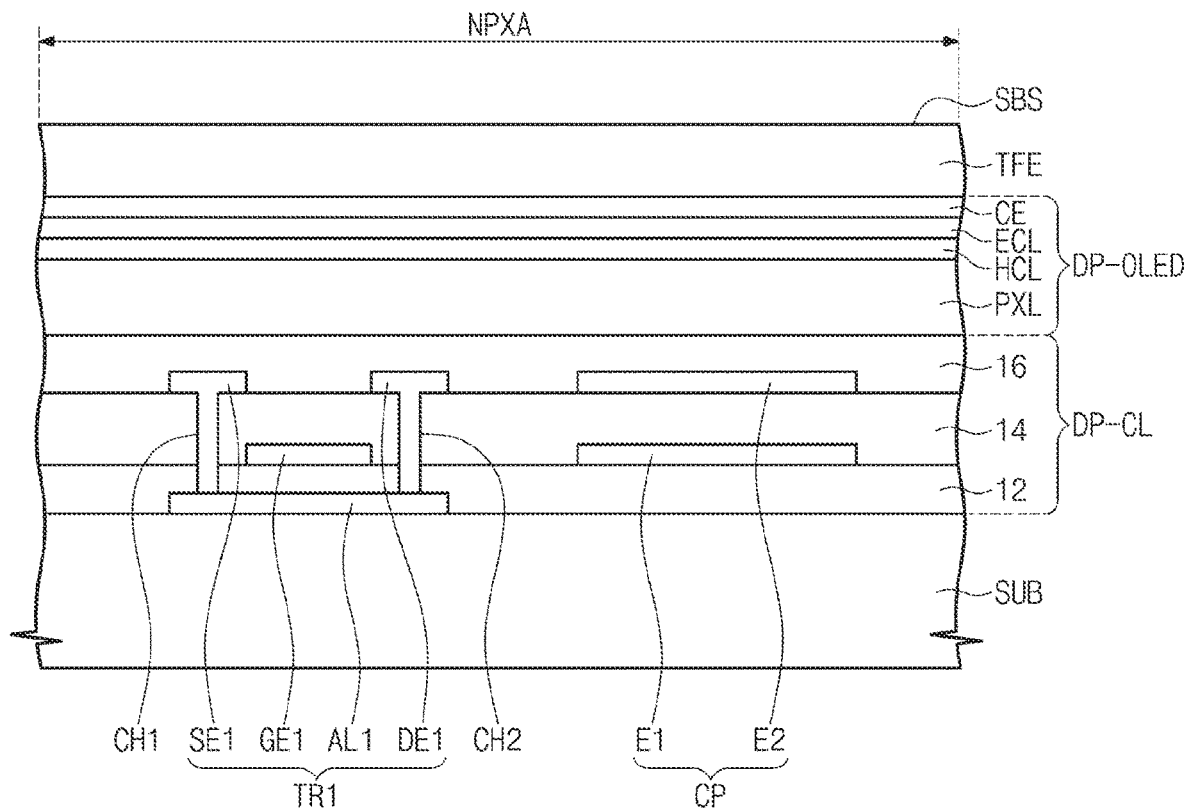
FIG. 6A and FIG. 6B are partial cross-sectional views illustrating an organic light emitting display panel according to an exemplary embodiment.
Figure 6B:
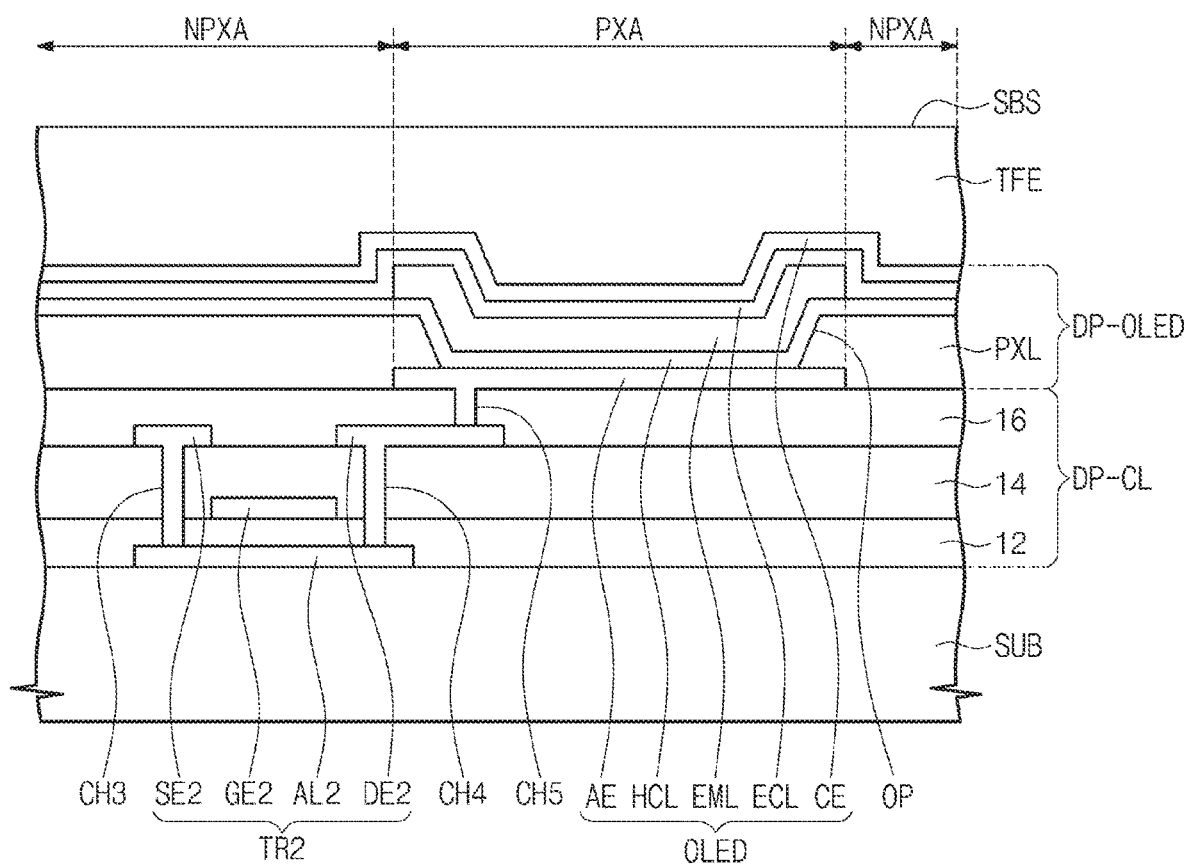

FIG. 5 is a plan view illustrating a portion of the organic light emitting display panel DP of FIG. 2. FIGS. 6A and 6B are partial cross-sectional views illustrating the organic light emitting display panel DP according to an exemplary embodiment. FIG. 5 illustrates a portion of the display area DA (see FIG. 3). FIG. 6A is a cross-sectional view illustrating a portion corresponding to the first transistor TR1 and the capacitor CP of the equivalent circuit illustrated in FIG. 4, and FIG. 6B is a cross-sectional view illustrating a portion corresponding to the second transistor TR2 and the organic light emitting device OLED of the equivalent circuit illustrated in FIG. 4.

As illustrated in FIG. 5, the organic light emitting display panel DP is divided into a plurality of light emitting areas PXA-R, PXA-G, and PXA-B, and a non-light emitting area NPXA on a plane defined by the first direction DR1 and the second direction DR2. For example, FIG. 5 illustrates three types of the light emitting areas PXA-R, PXA-G, and PXA-B arranged in a matrix form. Organic light emitting devices emitting lights of three different colors may be disposed in the three types of the light emitting areas PXA-R, PXA-G, and PXA-B, respectively.

The non-light emitting area NPXA may be divided into first non-light emitting areas NPXA-1 surrounding the light emitting areas PXA-R, PXA-G, and PXA-B, and a second non-light emitting area NPXA-2 disposed between the first non-light emitting areas NPXA-1. A driving circuit (e.g., the transistors TR1 and TR2 of FIG. 4 and/or the capacitor CP of FIG. 4) of a corresponding sub-pixel may be disposed in each of the first non-light emitting areas NPXA-1. Signal lines (e.g., the scan line SLi, the source line DLj, and the power source line PL of FIG. 4) may be disposed in the second non-light emitting area NPXA-2. However, according to an exemplary embodiment, the first non-light emitting areas NPXA-1 and the second non-light emitting area NPXA-2 may not be divided from each other.

Although not shown in the drawings, in an exemplary embodiment, each of the light emitting areas PXA-R, PXA-G, and PXA-B may have a shape similar to a diamond shape. According to an exemplary embodiment, organic light emitting devices emitting lights of four different colors may be disposed in four types of repeatedly arranged light emitting areas, respectively.

As used herein, emitting light of a predetermined color from a light emitting area may mean that light generated from a corresponding light emitting device is emitted as it is without any color conversion, or that a color of light generated from a corresponding light emitting device is converted and light of the converted color is emitted.

As illustrated in FIGS. 6A and 6B, the organic light emitting display panel DP includes a base substrate SUB, a circuit layer DP-CL, an organic light emitting device layer DP-OLED, and a thin film sealing layer TFE. The circuit layer DP-CL may include a plurality of conductive layers and a plurality of insulating layers, and the organic light emitting device layer DP-OLED may include a plurality of conductive layers and a plurality of functional organic layers.

The base substrate SUB may include a plastic substrate (e.g., polyimide), which may be flexible, a glass substrate, or a metal substrate. A semiconductor pattern AL1 (hereinafter, "a first semiconductor pattern") of the first transistor TR1 and a semiconductor pattern AL2 (hereinafter, "a second semiconductor pattern") of the second transistor TR2 are disposed on the base substrate SUB. The first semiconductor pattern AL1 and the second semiconductor pattern AL2 may include amorphous silicon formed at a low temperature. In an exemplary embodiment, the first semiconductor pattern AL1 and the second semiconductor pattern AL2 may alternatively include a metal oxide semiconductor. Although not shown in the drawings, functional layers may further be disposed on one surface of the base substrate SUB. The functional layers may include at least one of a barrier layer or a buffer layer. The first semiconductor pattern AL1 and the second semiconductor pattern AL2 may be disposed on the barrier layer or the buffer layer.

A first insulating layer 12 is disposed on the base substrate SUB and covers the first semiconductor pattern AL1 and the second semiconductor pattern AL2. The first insulating layer 12 includes an organic layer and/or an inorganic layer. In particular, the first insulating layer 12 may include a plurality of inorganic thin layers. The plurality of inorganic thin layers may include a silicon nitride layer and/or a silicon oxide layer.

A control electrode GE1 (hereinafter, "a first control electrode") of the first transistor TR1 and a control electrode GE2 (hereinafter, "a second control electrode") of the second transistor TR2 are disposed on the first insulating layer 12. A first electrode E1 of the capacitor CP is disposed on the first insulating layer 12. The first control electrode GE1, the second control electrode GE2, the first electrode E1, and the scan line SLi of FIG. 4 may be formed using the same photolithography process. In other words, the first electrode E1 may include the same material as the scan line SLi of FIG. 4.

A second insulating layer 14 is disposed on the first insulating layer 12 and covers the first control electrode GE1, the second control electrode GE2, and the first electrode E1. The second insulating layer 14 includes an organic layer and/or an inorganic layer. In particular, the second insulating layer 14 may include a plurality of inorganic thin layers. The plurality of inorganic thin layers of the second insulating layer 14 may include a silicon nitride layer and/or a silicon oxide layer.

The source line DLj of FIG. 4 and the power source line PL of FIG. 4 may be disposed on the second insulating layer 14. An input electrode SE1 (hereinafter, "a first input electrode") and an output electrode DE1 (hereinafter, "a first output electrode") of the first transistor TR1 are disposed on the second insulating layer 14. An input electrode SE2 (hereinafter, "a second input electrode") and an output electrode DE2 (hereinafter, "a second output electrode") of the second transistor TR2 are disposed on the second insulating layer 14. The first input electrode SE1 is branched from the source line DLj. The second input electrode SE2 is branched from the power source line PL.

A second electrode E2 of the capacitor CP is disposed on the second insulating layer 14. The second electrode E2 may be formed using the same photolithography process forming the source line DLj and the power source line PL, and may include the same material as the source line DLj and the power source line PL.

The first input electrode SE1 and the first output electrode DE1 are connected to portions of the first semiconductor pattern AL1 through a first through-hole CH1 and a second through-hole CH2 penetrating the first and second insulating layers 12 and 14, respectively. The first output electrode DE1 may be electrically connected to the first electrode E1. For example, the first output electrode DE1 may be connected to the first electrode E1 through a through-hole (not shown) penetrating the second insulating layer 14. The second input electrode SE2 and the second output electrode DE2 are connected to portions of the second semiconductor pattern AL2 through a third through-hole CH3 and a fourth through-hole CH4 penetrating the first and second insulating layers 12 and 14, respectively. Meanwhile, in an exemplary embodiment, the first transistor TR1 and the second transistor TR2 may have bottom gate structures.

A third insulating layer 16 is disposed on the second insulating layer 14 and covers the first input electrode SE1, the first output electrode DE1, the second input electrode SE2, and the second output electrode DE2. The third insulating layer 16 includes an organic layer and/or an inorganic layer. In particular, the third insulating layer 16 may include an organic material to provide a flat surface.

A pixel defining layer PXL and the organic light emitting device OLED are disposed on the third insulating layer 16. An opening OP is defined in the pixel defining layer PXL.

The pixel defining layer PXL may include an insulating layer. The opening OP of FIG. 6B may correspond to any one of the openings OP-R, OP-G, and OP-B of FIG. 5.

An anode AE is connected to the second output electrode DE2 through a fifth through-hole CH5 penetrating the third insulating layer 16. The opening OP of the pixel defining layer PXL exposes a portion of the anode AE. A hole control layer HCL may be formed in common in the light emitting areas PXA-R, PXA-G, and PXA-B, and the non-light emitting area NPXA of FIG. 5. An organic light emitting layer EML and an electron control layer ECL are sequentially formed on the hole control layer HCL. Thereafter, a cathode CE may be formed in common in the light emitting areas PXA-R, PXA-G, and PXA-B, and the non-light emitting area NPXA. The cathode CE may be formed by a deposition method or a sputtering method on the basis of a layer structure.

The thin film sealing layer TFE is disposed on the cathode CE. The thin film sealing layer TFE protects the organic light emitting device OLED from moisture and a foreign material. One surface of the thin film sealing layer TFE may be a base surface SBS on which a touch electrode layer (see FIG. 10) is disposed.

Figure 7:
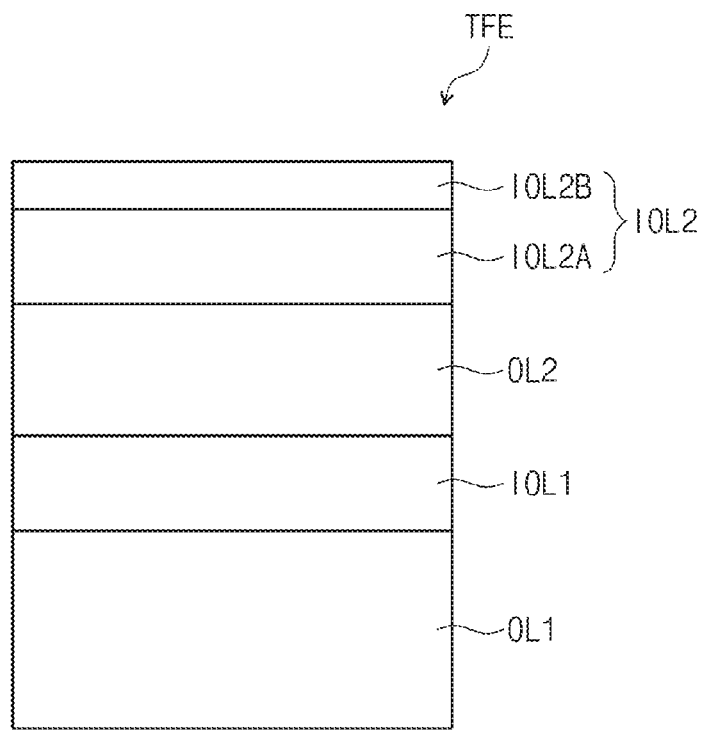
FIG. 7 is a cross-sectional view illustrating a thin film sealing layer of FIGS. 6A and 6B.
Figure 8:
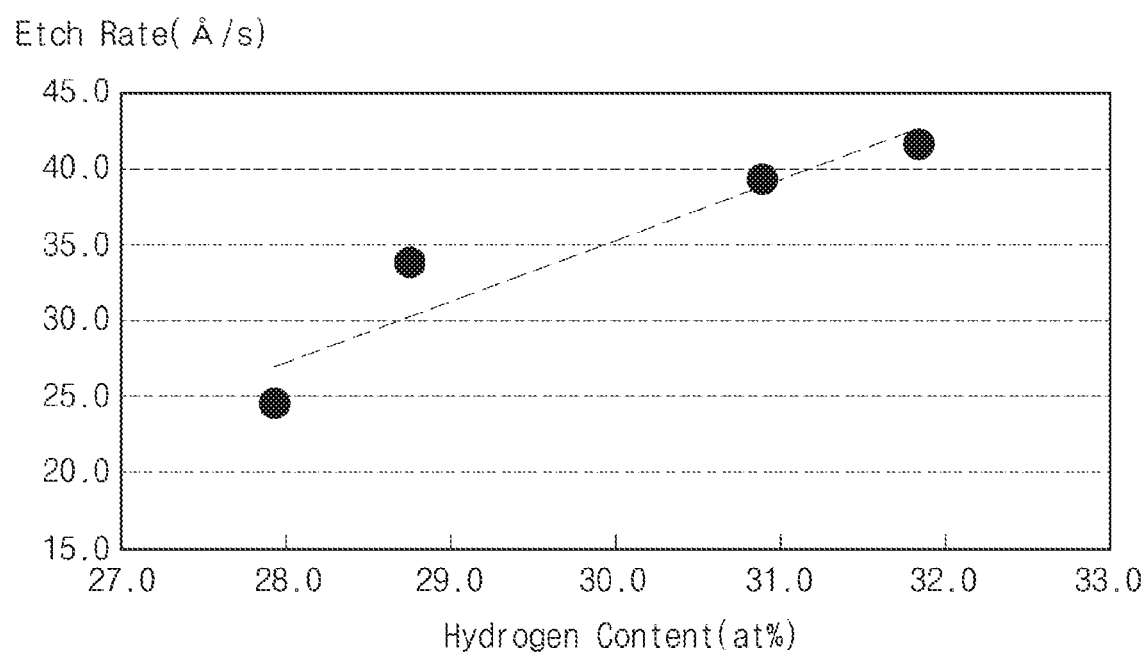
FIG. 8 is a graph illustrating a variation of an etch rate according to a hydrogen content.

FIG. 7 is a cross-sectional view illustrating the thin film sealing layer TFE illustrated in FIGS. 6A and 6B. The thin film sealing layer TFE according to an exemplary embodiment will be described with reference to FIG. 7. FIG. 8 is a graph illustrating a variation of an etch rate according to a hydrogen content.

The thin film sealing layer TFE includes at least two inorganic thin layers IOL1 and IOL2 and organic thin layers OL1 and OL2. The organic thin layers OL1 and OL2 and the inorganic thin layers IOL1 and IOL2 may be alternately stacked. The inorganic thin layers IOL1 and IOL2 may protect the organic light emitting device OLED from moisture, and the organic thin layers OL1 and OL2 may protect the organic light emitting device OLED from foreign material, such as dust particles. Although not shown in the drawings, an inorganic thin layer or an organic thin layer may further be disposed under a first organic thin layer OL1.

An average thickness of the organic thin layers OL1 and OL2 may be greater than that of the inorganic thin layers IOL1 and IOL2. Each of the inorganic thin layers IOL1 and IOL2 may be a single layer including one material or may have a plurality of stacked layers including different materials. Each of the inorganic thin layers IOL1 and IOL2 may include lithium fluoride, aluminum oxide, silicon nitride, or silicon oxide, without being limited thereto.

Each of the organic thin layers OL1 and OL2 may be formed by depositing organic monomers. The organic monomers may include an acrylic-based monomer, although the inventive concepts are limited thereto.

One of the organic thin layers OL1 and OL2 may be a color filter layer including color filters. The one organic thin layer may further include a black matrix. One of the organic thin layers OL1 and OL2 may include color filters, and the other one of the organic thin layers OL1 and OL2 may include a black matrix. Other organic thin layers may be planarization layers.

The thin film sealing layer TFE may include a first organic thin layer OL1, a first inorganic thin layer IOL1, a second organic thin layer OL2, and a second inorganic thin layer IOL2, which are sequentially stacked over one another.

The second inorganic thin layer IOL2 may include a first inorganic layer IOL2A and a second inorganic layer IOL2B disposed on a top surface of the first inorganic layer IOL2A. A thickness of the second inorganic layer IOL2B may be less than a thickness of the first inorganic layer IOL2A. An etch rate of the second inorganic layer IOL2B is less than an etch rate of the first inorganic layer IOL2A.

As used herein, the term "etch rate" means a rate at which a material is removed from a surface of a wafer during an etching process. The etch rate may be generally measured in Å/min or Å/sec. The etch rate is determined according to various apparatus conditions and/or process conditions, such as a setting condition of a process parameter, a gas used in an etching process, a configuration of a reactor, and/or a material to be etched.

In an exemplary embodiment, the first inorganic layer IOL2A may have a first etch rate, and the second inorganic layer IOL2B may have a second etch rate less than the first etch rate. The first etch rate or the second etch rate may range from 20 Å/sec to 45 Å/sec.

In an exemplary embodiment, the etch rate of the first inorganic layer IOL2A is different from the etch rate of the second inorganic layer IOL2B, due to a different hydrogen content in the first and second inorganic layers IOL 2A and IOL2B. The content is defined as the amount of a component contained in a material. The hydrogen content of each of the layers IOL2A and IOL2B may be measured by composition analysis using a transmission electron microscope (TEM).

The first inorganic layer IOL2A may include a first content of hydrogen, and the second inorganic layer IOL2B may include a second content of hydrogen less than the first content. Referring to FIG. 8, the etch rate increases as the hydrogen content increases, and the etch rate decreases as the hydrogen content decreases. As such, the amount of hydrogen included in the second inorganic layer IOL2B may be controlled to be less that of the first inorganic layer IOL2A, such that the etch rate of the second inorganic layer IOL2B may be less than the etch rate of the first inorganic layer IOL2A. A touch electrode layer ET-TC (see FIG. 10) is disposed on a top surface of the second inorganic layer IOL2B.

Figure 9A:
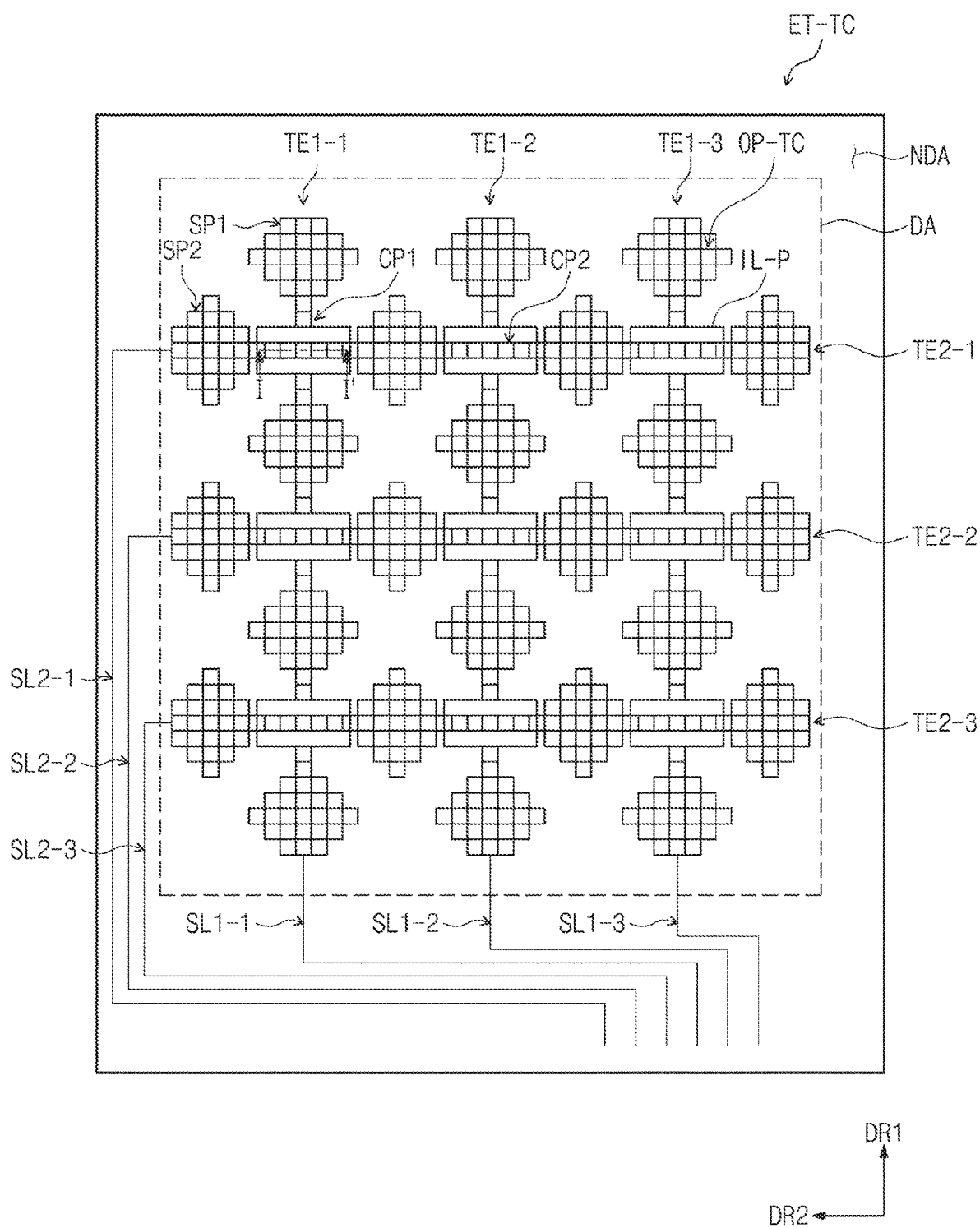
FIG. 9A is a plan view illustrating a touch electrode layer according to an exemplary embodiment.
Figure 9B:
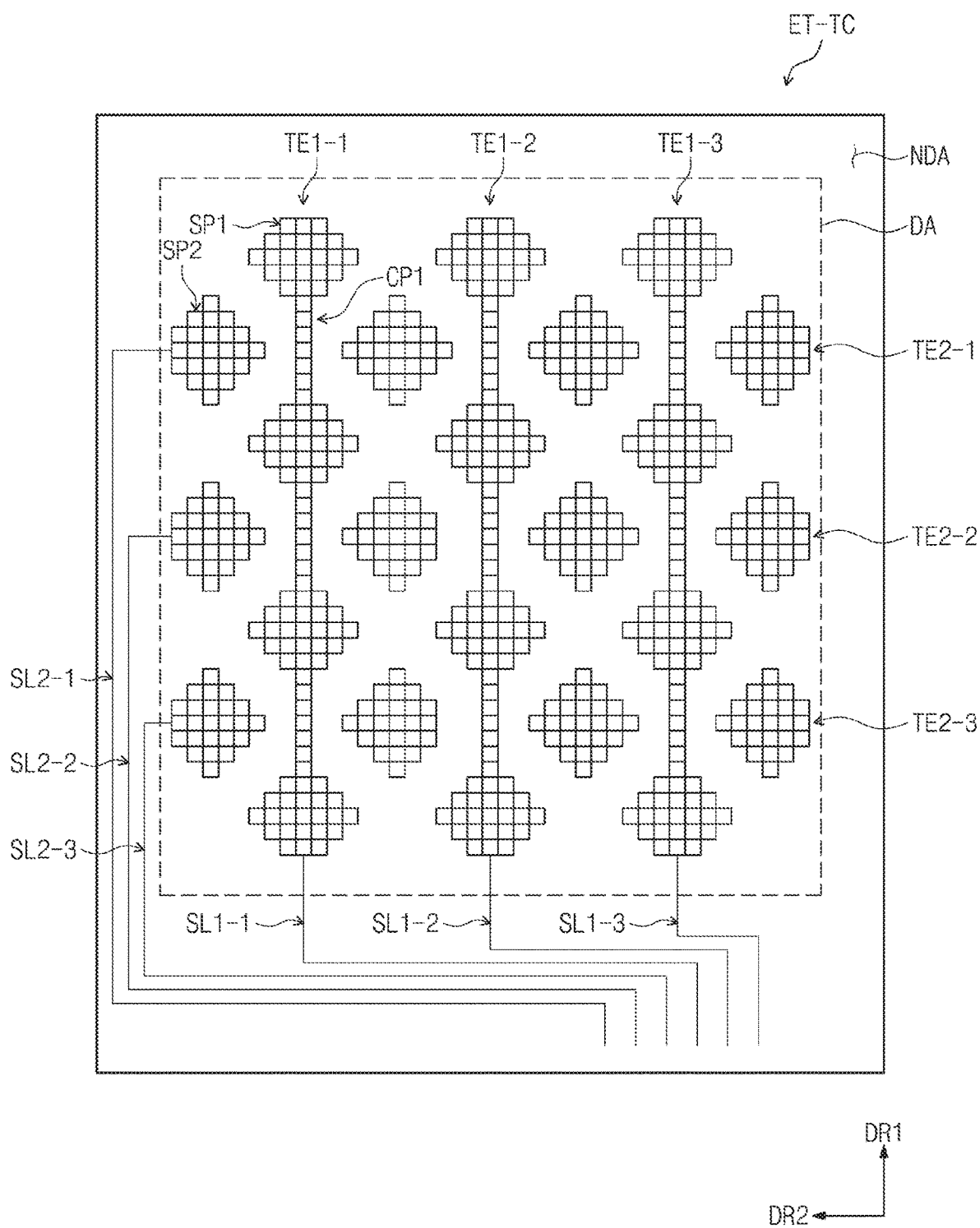
FIG. 9B and FIG. 9C are plan views illustrating portions of the touch electrode layer of FIG. 9A.
Figure 9C:
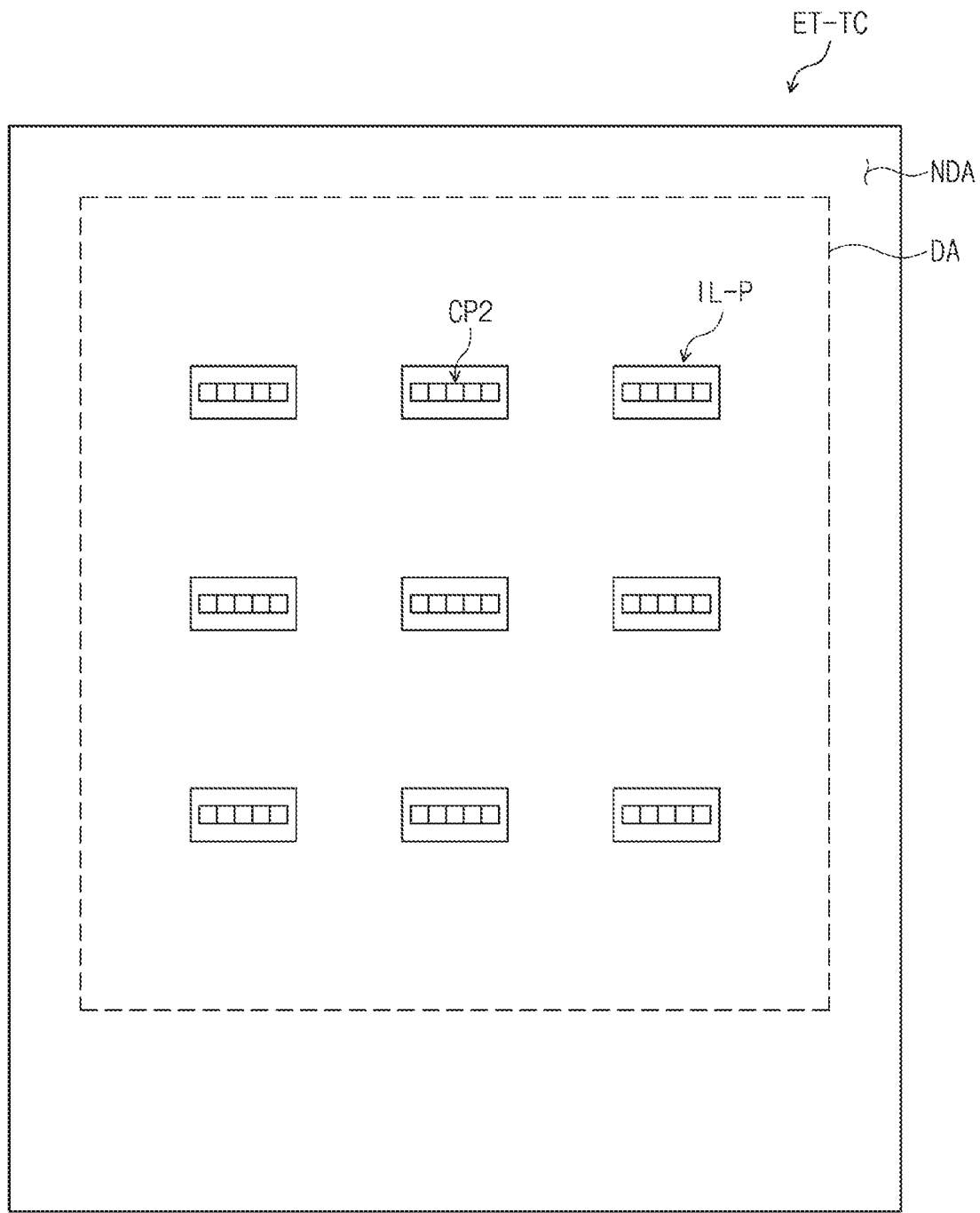

FIG. 9A is a plan view illustrating a touch electrode layer ET-TC according to an exemplary embodiment. FIGS. 9B and 9C are plan views illustrating portions of the touch electrode layer ET-TC of FIG. 9A.

In an exemplary embodiment of FIG. 9A, a one-layered capacitive touch sensing member is illustrated as an example. However, the touch sensing member may be driven by a self-capacitance method, and a method of driving the touch sensing member to obtain coordinate information is not particularly limited. In addition, the structure of the touch sensing member is not limited to the one-layered structure. For example, in an exemplary embodiment, the touch sensing member may have at least two-layered structure.

The touch electrode layer ET-TC may include first touch patterns TE1-1, TE1-2, and TE1-3, first touch signal lines SL1-1, SL1-2, and SL1-3, second touch patterns TE2-1, TE2-2, and TE2-3, and second touch signal lines SL2-1, SL2-2, and SL2-3.

Referring to FIGS. 9A and 9B, three first touch patterns TE1-1 to TE1-3 and the first touch signal lines SL1-1 to SL1-3 connected thereto are illustrated as an example. In addition, three second touch patterns TE2-1 to TE2-3 and the second touch signal lines SL2-1 to SL2-3 connected thereto are illustrated as an example.

The first touch patterns TE1-1 to TE1-3 extend in the first direction DR1 and are arranged in the second direction DR2. Each of the first touch patterns TE1-1 to TE1-3 may have a mesh shape including a plurality of touch openings OP-TC.

Each of the first touch patterns TE1-1 to TE1-3 includes a plurality of first sensing patterns SP1 and a plurality of first connecting patterns CP1. The first sensing patterns SP1 are arranged in the first direction DR1. Each of the first connecting patterns CP1 connects adjacent first sensing patterns SP1 to each other.

The first touch signal lines SL1-1 to SL1-3 may also have mesh shapes. The first touch signal lines SL1-1 to SL1-3 may have the same layer structure as the first touch patterns TE1-1 to TE1-3.

Referring to FIGS. 9A and 9B, three second touch patterns TE2-1 to TE1-3 and the second touch signal lines SL2-1 to SL2-3 connected thereto are illustrated as an example.

The second touch patterns TE2-1 to TE2-3 intersect the first touch patterns TE1-1 to TE1-3. The second touch patterns TE2-1 to TE2-3 may be insulated from the first touch patterns TE1-1 to TE1-3 by a plurality of insulating patterns IL-P. The insulating patterns IL-P may include an inorganic material or an organic material. The inorganic material may include silicon oxide or silicon nitride. The organic material may include at least one of an acrylic-based resin, a methacrylic-based resin, polyisoprene, a vinyl-based resin, an epoxy-based resin, a urethane-based resin, a cellulose-based resin, and a perylene-based resin.

Each of the second touch patterns TE2-1 to TE2-3 may have a mesh shape including a plurality of touch openings OP-TC. Each of the second touch patterns TE2-1 to TE2-3 includes a plurality of second sensing patterns SP2 and a plurality of second connecting patterns CP2. The second sensing patterns SP2 are arranged in the second direction DR2. Each of the second connecting patterns CP2 connects adjacent second sensing patterns SP2 to each other.

As illustrated in FIGS. 9B and 9C, the second connecting patterns CP2 may function as a bridge. In particular, the insulating patterns IL-P are disposed on the first connecting patterns CP1, and the second connecting patterns CP2 are disposed on the insulating patterns IL-P.

The second touch signal lines SL2-1 to SL2-3 may also have mesh shapes. The second touch signal lines SL2-1 to SL2-3 may have the same layer structure as the second touch patterns TE2-1 to TE2-3.

The first touch patterns TE1-1 to TE1-3 are capacitively coupled to the second touch patterns TE2-1 to TE2-3. In particular, as touch sensing signals are applied to the first touch patterns TE1-1 to TE1-3, capacitors may be formed between the first sensing patterns SP1 and the second sensing patterns SP2.

The above mentioned shapes of the first and second touch patterns TE1-1 to TE1-3 and TE2-1 to TE2-3 are described as an example, and are not limited thereto. In an exemplary embodiment, the shapes of the connecting patterns CP1 and CP2 may be variously modified, as long as the connecting patterns CP1 and CP2 are disposed at crossing portions of the first touch patterns TE1-1 to TE1-3 and the second touch patterns TE2-1 to TE2-3. In addition, the shapes of the sensing patterns SP1 and SP2 may be variously modified, as long as the sensing patterns SP1 and SP2 are disposed at non-overlapping portions of the first touch patterns TE1-1 to TE1-3 and the second touch patterns TE2-1 to TE2-3. For example, each of the first and second touch patterns TE1-1 to TE1-3 and TE2-1 to TE2-3 may have a bar shape having a certain width.

Figure 10:
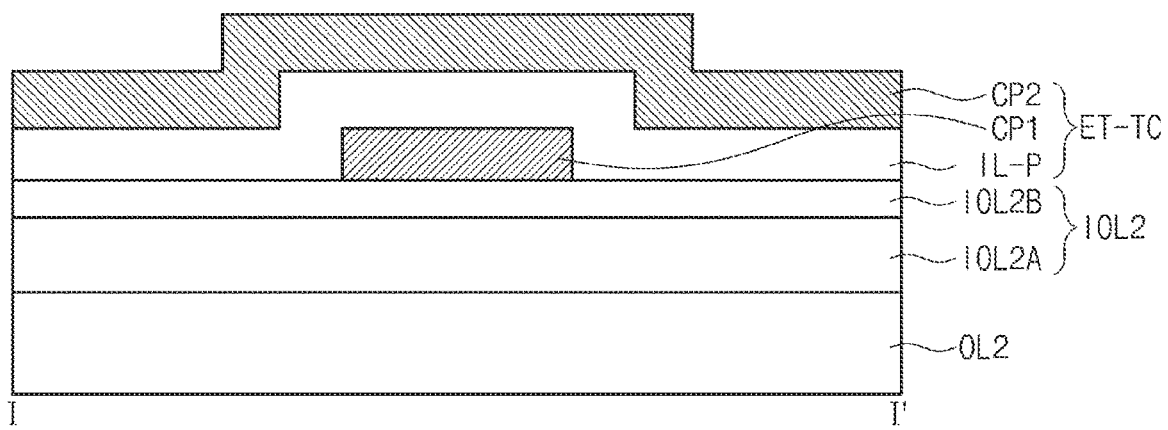
FIG. 10 is a cross-sectional view taken along line I-I' of FIG. 9A.
Figure 11:
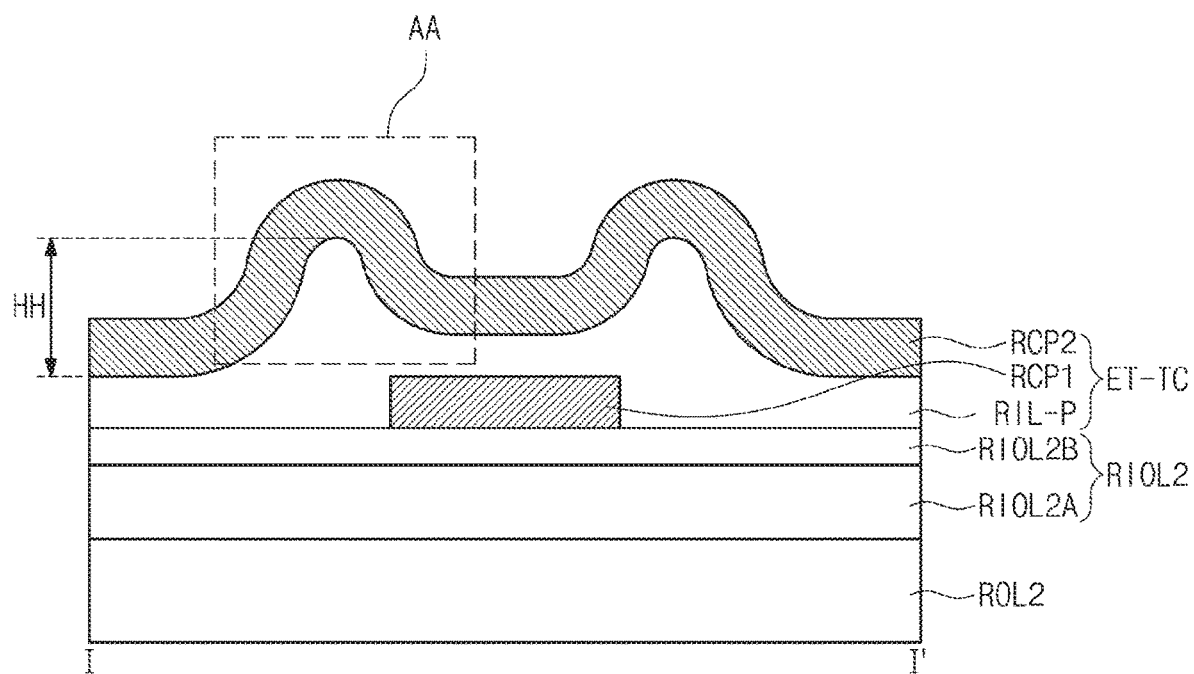
FIG. 11 illustrates a structure corresponding to FIG. 10, which is realized by real processes.

FIG. 10 is a cross-sectional view taken along line I-I' of FIG. 9A, and illustrates the touch electrode layer ET-TC of FIG. 9A. FIG. 11 illustrates a shape of which the structure of FIG. 10 has been actually manufactured in real processes.

Figure 12:
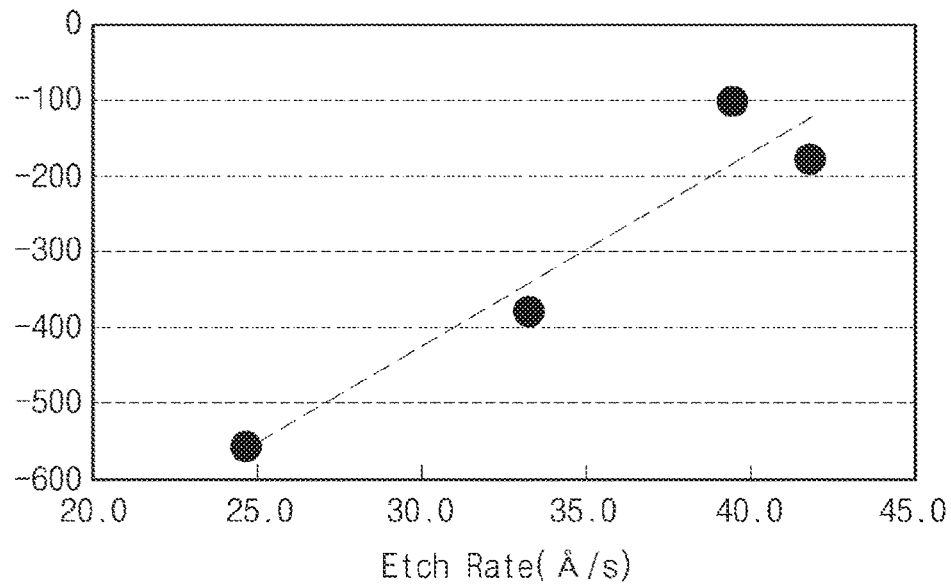
FIG. 12 is a graph illustrating relation between a stress and an etch rate of an inorganic layer disposed on an organic layer.

FIG. 12 is a graph illustrating relation between a stress and an etch rate of an inorganic layer disposed on an organic layer.

The touch electrode layer ET-TC is disposed on the second inorganic layer IOL2B. FIG. 10 illustrates the first connecting pattern CP1, the second connecting pattern CP2, and the insulating pattern IL-P of the touch electrode layer ET-TC according to an exemplary embodiment.

The first connecting pattern CP1 may be directly disposed on the second inorganic layer IOL2B. The insulating pattern IL-P may be disposed on the second inorganic layer IOL2B to cover at least a portion of the first connecting pattern CP1. The second connecting pattern CP2 may be disposed on the insulating pattern IL-P to overlap a portion of the first connecting pattern CP1.

FIG. 11 illustrates the shape of which the structure of FIG. 10 has been actually manufactured in real process.

A second organic thin layer ROL2, a second inorganic thin layer RIOL2, a first connecting pattern RCP1, an insulating pattern RIL-P, and a second connecting pattern RCP2 of FIG. 11 correspond to the second organic thin layer OL2, the second inorganic thin layer IOL2, the first connecting pattern CP1, the insulating pattern IL-P, and the second connecting pattern CP2 of FIG. 10, respectively.

Referring to region "AA" of FIG. 11, when the insulating pattern RIL-P is formed after the first connecting pattern RCP1 is formed on a second inorganic layer RIOL2B, the insulating pattern RIL-P may be curved by a predetermined height HH (hereinafter, "a curved height HH"). If the curved height HH is increased, an electrical short may occur between the first connecting pattern RCP1 and the second connecting pattern RCP2 during the process of arranging the second connecting pattern RCP2. In addition, various defects may occur in subsequent processes.

The curved height HH of the insulating pattern RIL-P may be varied according to an etch rate of the second inorganic layer RIOL2B. Since the curved shape of the insulating pattern RIL-P may occur from defects generated in the second inorganic layer RIOL2B during an etching process, the curved height HH may be decreased as the etch rate of the second inorganic layer RIOL2B decreases. More particularly, process faults (or defects) may be decreased as the etch rate of the second inorganic layer RIOL2B is decreased. As described above, the etch rate of the second inorganic layer RIOL2B may be determined by adjusting the hydrogen content thereof.

The second inorganic thin layer RIOL2 may be formed to include the first inorganic layer IOL2A or RIOL2A and the second inorganic layer IOL2B or RIOL2B as illustrated in FIG. 10 or 11, instead of including a single layer that has an overall low etch rate. This will be described in detail with reference to FIG. 12.

Referring to FIG. 12, the etch rate decreases as the absolute value of a stress applied to the first inorganic layer IOL2A or RIOL2A disposed on the second organic thin layer OL2 or ROL2 is increased. The stress is due to a property difference between the first inorganic layer IOL2A or RIOL2A and the second organic thin layer OL2 or ROL2, and the etch rate of the first inorganic layer IOL2A or RIOL2A.

If the absolute value of the stress applied to the first inorganic layer IOL2A or RIOL2A increases, wrinkles may be formed on a surface of the first inorganic layer IOL2A or RIOL2A, which may lead to process faults.

According to an exemplary embodiment, since the second inorganic layer IOL2B or RIOL2B having a low etch rate and a thin thickness is disposed on the first inorganic layer IOL2A or RIOL2A having a high etch rate, the process faults caused by the wrinkles of the first inorganic layer IOL2A or RIOL2A and the process faults caused by the curved shape of the insulating pattern RIL-P may be reduced.

Figure 13:
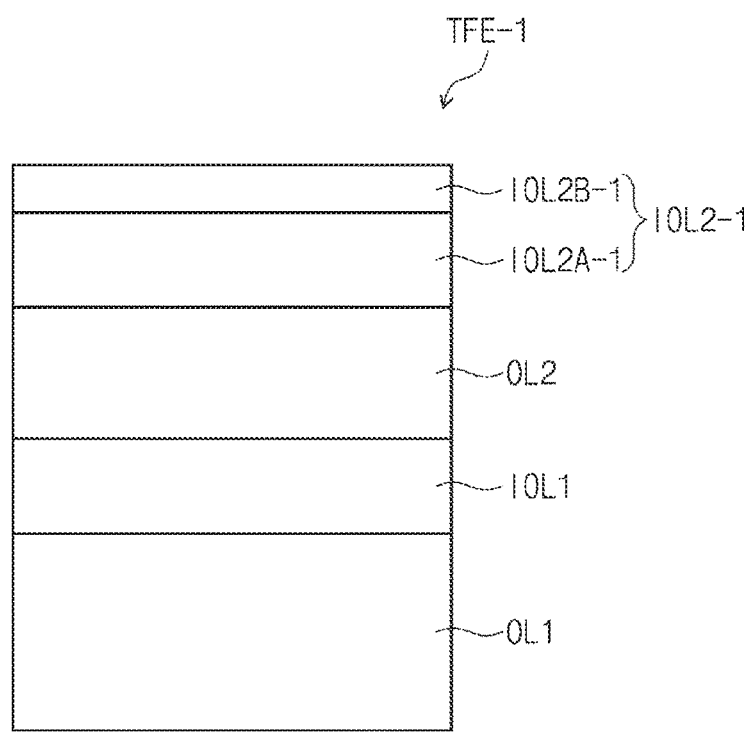
FIG. 13 is a cross-sectional view illustrating a thin film sealing layer according to an exemplary embodiment.

FIG. 13 is a cross-sectional view illustrating a thin film sealing layer TFE-1 according to an exemplary embodiment.

The thin film sealing layer TFE-1 may include a first organic thin layer OL1, a first inorganic thin layer IOL1, a second organic thin layer OL2, and a second inorganic thin layer IOL2-1. The first organic thin layer OL1, the first inorganic thin layer IOL1, and the second organic thin layer OL2 are substantially the same as those having the same reference numerals described above, and thus, repeated descriptions thereof will be omitted.

The second inorganic thin layer IOL2-1 includes a first inorganic layer IOL2A-1 and a second inorganic layer IOL2B-1 disposed on a top surface of the first inorganic layer IOL2A-1.

The first inorganic layer IOL2A-1 may include silicon nitride, and the second inorganic layer IOL2B-1 may include silicon oxide or aluminum oxide. Generally, an etch rate of an inorganic layer including silicon oxide or aluminum oxide may be lower than an etch rate of an inorganic layer including silicon nitride.

Unlike the thin film sealing layer TFE illustrated in FIG. 7, the etch rate of the second inorganic layer IOL2B-1 of the thin film sealing layer TFE-1 of FIG. 13 may be lower than the etch rate of the first inorganic layer IOL2A-1 of the thin film sealing layer TFE-1, by forming the first inorganic layer IOL2A-1 and the second inorganic layer IOL2B-1 with different inorganic materials.

Although not shown in the drawings, an additional inorganic thin layer or organic thin layer may be disposed under the first organic thin layer OL1 of the thin film sealing layer TFE-1.

According to exemplary embodiments, it is possible to reduce a fault rate caused by an electrical short between touch electrodes, which may occur in a process of forming the touch electrodes of the display device.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display device comprising:
   a display panel comprising a light emitting device and a thin film sealing layer disposed on the light emitting device, the display panel providing a base surface; and
   an input sensing member comprising a sensing electrode layer and disposed on the base surface,
   wherein the thin film sealing layer comprises:
      a first inorganic layer comprising a first content of hydrogen; and
      a second inorganic layer disposed on the first inorganic layer and comprising a second content of hydrogen less than the first content, and
   wherein a portion where the first inorganic layer and the second inorganic layer contact each other overlaps the light emitting device.

2. The display device of claim 1, wherein the second inorganic layer contacts a top surface of the first inorganic layer.

3. The display device of claim 2, wherein the sensing electrode layer contacts the base surface.

4. The display device of claim 3, wherein the second inorganic layer comprises the base surface.

5. The display device of claim 4, wherein at least one of the first inorganic layer and the second inorganic layer comprises silicon nitride.

6. The display device of claim 5, wherein the thin film sealing layer further comprises an organic layer contacting a bottom surface of the first inorganic layer.

7. The display device of claim 1, wherein the sensing electrode layer comprises:
   a plurality of first touch patterns extending in a first direction and arranged in a second direction intersecting the first direction; and
   a plurality of second touch patterns extending in the second direction and arranged in the first direction.

8. The display device of claim 7, wherein a plurality of touch openings are defined in the first touch patterns and the second touch patterns.

9. The display device of claim 8, wherein each of the first touch patterns comprises:
   a plurality of first sensing patterns arranged in the first direction; and
   a plurality of first connecting patterns each connecting adjacent first sensing patterns.

10. The display device of claim 9, wherein each of the second touch patterns comprises:
    a plurality of second sensing patterns arranged in the second direction; and
    a plurality of second connecting patterns each connecting adjacent second sensing patterns.

11. The display device of claim 10, further comprising a plurality of insulating patterns disposed on the first connecting patterns, respectively,
    wherein:
    the first sensing patterns and the second sensing patterns are disposed in the same layer; and
    each of the second connecting patterns is disposed on a corresponding insulating pattern.

12. The display device of claim 8, wherein:
    the display panel further comprises a plurality of light emitting areas and a non-light emitting area adjacent to the light emitting areas; and
    each of the light emitting areas overlaps a corresponding touch opening.

13. A display device comprising:
    a display panel comprising an organic light emitting device and a thin film sealing layer disposed on the organic light emitting device, wherein the display panel provides a base surface; and
    an input sensing member comprising a sensing electrode layer disposed on the base surface,
    wherein the thin film sealing layer comprises:
       a first inorganic layer having a first etch rate; and
       a second inorganic layer disposed on the first inorganic layer and having a second etch rate less than the first etch rate, and
    wherein a portion where the first inorganic layer and the second inorganic layer contact each other overlaps the organic light emitting device.

14. The display device of claim 13, wherein:
    the second inorganic layer contacts a top surface of the first inorganic layer; and
    the sensing electrode layer contacts the base surface.

15. The display device of claim 14, wherein the second inorganic layer comprises the base surface.

16. The display device of claim 15, wherein the first inorganic layer comprises silicon nitride.

17. The display device of claim 16, wherein the second inorganic layer comprises at least one of silicon oxide and aluminum oxide.

18. The display device of claim 16, wherein:
the second inorganic layer comprises silicon nitride;
the first inorganic layer comprises a first content of hydrogen; and
the second inorganic layer comprises a second content of hydrogen less than the first content.

19. A display device comprising:
an organic light emitting device;
a thin film sealing layer providing a base surface, the thin film sealing layer disposed on the organic light emitting device; and
a plurality of sensing electrodes disposed on the base surface,
wherein the thin film sealing layer comprises:
an organic layer comprising a monomer;
a first inorganic layer disposed on a top surface of the organic layer, the first inorganic layer having a first etch rate; and
a second inorganic layer contacting a top surface of the first inorganic layer, the second inorganic layer having a second etch rate less than the first etch rate, and the second inorganic layer providing the base surface, and
wherein a portion where the first inorganic layer and the second inorganic layer contact each other overlaps the organic light emitting device.

20. The display device of claim 19, wherein:
the first inorganic layer comprises a first content of hydrogen; and
the second inorganic layer comprises a second content of hydrogen less than the first content.

* * * * *